United States Patent
Matsumiya

(10) Patent No.: US 7,592,623 B2
(45) Date of Patent: Sep. 22, 2009

(54) SEMICONDUCTOR DEVICE INCLUDING WIRING CONNECTION TESTING STRUCTURE

(75) Inventor: Yasuo Matsumiya, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 166 days.

(21) Appl. No.: 11/115,411

(22) Filed: Apr. 27, 2005

(65) Prior Publication Data

US 2006/0175607 A1 Aug. 10, 2006

(30) Foreign Application Priority Data

Feb. 9, 2005 (JP) .............................. 2005-033549

(51) Int. Cl.
*H01L 23/58* (2006.01)
(52) U.S. Cl. ........... 257/48; 257/E21.522; 257/E21.521
(58) Field of Classification Search .................. 257/48, 257/E21.521, E21.522; 324/751, 769
See application file for complete search history.

(56) References Cited

U.S. PATENT DOCUMENTS

| | | | | |
|---|---|---|---|---|
| 6,495,856 B2* | 12/2002 | Kikuchi | ........................ | 257/48 |
| 6,636,064 B1* | 10/2003 | Satya et al. | .................. | 324/763 |
| 6,734,687 B1* | 5/2004 | Ishitani et al. | ............... | 324/751 |
| 6,822,472 B1* | 11/2004 | Das et al. | ..................... | 324/765 |
| 6,895,346 B2* | 5/2005 | Hamamura et al. | ........... | 702/58 |
| 7,083,992 B2 | 8/2006 | Ogawa et al. | | |

FOREIGN PATENT DOCUMENTS

| | | |
|---|---|---|
| JP | 2001-305194 | 10/2001 |
| JP | 2004-501505 | 1/2004 |
| JP | 2004-095961 A | 3/2004 |
| JP | 2004-111839 A | 4/2004 |
| WO | WO01/80304 | 10/2001 |

OTHER PUBLICATIONS

Office Action dated Feb. 5, 2008 issued in corresponding to Japanese Application No. 2005-033549.

* cited by examiner

*Primary Examiner*—Jerome Jackson, Jr.
*Assistant Examiner*—Jose R Diaz
(74) *Attorney, Agent, or Firm*—Westerman, Hattori, Daniels & Adrian, LLP.

(57) ABSTRACT

A semiconductor device includes a substrate, a semiconductor element formed on the substrate, and a wiring connection testing structure which is formed on the substrate and which includes an electron beam irradiation area where an electron beam is irradiated so that a wiring connection is tested. The wiring connection testing structure includes an insulation layer formed on the substrate, a plurality of first pattern wirings which are formed on the insulation layer in parallel and which include the electron beam irradiation area, a second pattern wiring formed between the first pattern wirings, a third pattern wiring which is formed on a lower layer of the second pattern wiring and which is connected to the second pattern wiring, and a fourth pattern wiring which is formed on an upper layer of the third pattern wiring, is connected to the third pattern wiring, and has the electron beam irradiation area.

17 Claims, 16 Drawing Sheets

SEMICONDUCTOR DEVICE INCLUDING WIRING CONNECTION TESTING STRUCTURE

BACKGROUND OF THE INVENTION

1. Field of the Invention

The present invention generally relates to semiconductor devices, device forming substrates, wiring connection testing methods, and manufacturing methods of the semiconductor devices, and more specifically, to a semiconductor device having a wiring connection testing structure formed on a substrate, a device forming substrate, a wiring connection testing method using the wiring connection testing structure, and a manufacturing method of the semiconductor device.

2. Description of the Related Art

Recently, based on improvement in performance of semiconductor devices and the microstructure of the semiconductor devices, it has become necessary to promptly and efficiently detect a defect in a circuit such as bad wiring of the semiconductor device, so that reliability of the semiconductor device can be improved and reduction of manufacturing cost can be realized.

Conventionally, an optical type defect detection device is used as a measure for detecting defects in the circuits of semiconductor devices. However, in this detection device, it is difficult to determine whether the detected defect is an electric defect such as a defect accompanying a short circuit of the wiring. Hence, in this device, it is difficult to detect a defect of a circuit having a high precision.

Because of this, recently, a method for finding a part where the short circuit happens by voltage contrast (hereinafter "VC") detection has been suggested. The VC detection is for detecting a change of variable density of the wiring by observation using an electron microscope. Such a VC is detected based on the existence of a charge up phenomenon of the wiring.

For example, the following methods are used for detecting the defect part of the wiring by using the above-mentioned VC detection.

FIG. 1 is a first schematic view showing a related art test pattern 1 that is an example of a test pattern for finding a defect part of the wiring by VC detection.

Referring to FIG. 1, in this test pattern 1, a ground wiring pattern 2 is formed on an insulation layer (not shown in FIG. 1) formed on a substrate. Furthermore, a wiring pattern 3 being in an electric floating state against the wiring pattern 2 is provided so as to form a comb teeth-shaped pattern with the wiring pattern 2. That is, the ground wiring pattern and floating wiring pattern which extend in the same direction are reciprocally provided on the insulation layer of the substrate.

For the purpose of detection of the defect part (short circuit part) by using this test pattern, first, an area x1, for example, is observed in a direction crossing the wiring, namely an x1 direction, by using an electron microscope. In this case, a pattern shorting with the wiring pattern 2 has a different image contrast than image contrasts of other wiring patterns among plural wiring patterns 3. While the wiring pattern 3 having no shorted part is in an electric floating state and thereby the charge up phenomenon is generated, the charge up phenomenon is not generated in the wiring pattern 3 shorting with the ground wiring pattern 2, and the difference in surface potential of these wiring patterns 3 is observed as a difference of the variable density in the observation using the electron microscope., namely as a difference of the state of the VC. Because of this, the coordinates in the x1 direction of the shorted part of the wiring pattern 3 can be specified.

Next, an observation of the wiring pattern along the y1 direction perpendicular to the x1 direction is implemented corresponding to the coordinates in the x1 direction, so that the defect part deft of the wiring can be detected. See Japan National Publication of Translated Version of PCT Application No. 2004-501505.

Such a shorted part can be detected by using a test pattern discussed below.

FIG. 2 is a second schematic view showing a related art test pattern 70 that is another example of the test pattern for finding the defect part of the wiring by the VC detection.

Referring to FIG. 2, in this test pattern, a ground wiring pattern 11 is formed on an insulation layer (not shown in FIG. 2) formed on a substrate. Furthermore, a wiring pattern 12 being in an electric floating state against the wiring pattern 11 and including plural cut line segments are provided in the space of in wiring pattern 11. That is, plural cut line segments of the wiring pattern 12 being in an electric floating state are reciprocally provided between neighboring lines of wiring pattern 11.

In a case where the defect part (short circuit part) is detected by using this test pattern, the wiring pattern 12 composed of plural line segments is scanned in the x2 direction in line turn by using the electron microscope so that the wiring pattern where the VC is generated is specified and therefore the shorted part def2 is detected. See Japan Laid-Open Patent Publication No. 2001-305194.

However, in the case of the detection method using the above-mentioned wiring pattern 1, it may be difficult to detect a defect part of a micro-wiring pattern. For example, in the micro-wiring pattern, it is difficult to detect the defect part in the y1 direction in FIG. 1 by using an electron microscope. It may be more difficult to detect a defect part of a more-micro wiring pattern. Furthermore, there is a porous insulation film that is a low dielectric constant insulation film used for preventing an influence of wiring delay. In such a porous insulation film, a shorted part of the wiring may exist in a porous part of the inside of the porous insulation film. It may be difficult to detect such a shorted part formed in the wiring inside of the porous insulation film by observation of the wiring pattern surface.

In addition, in the case of the detection method using the above-mentioned test pattern 70, it is necessary to observe by scanning the cut wiring pattern 12 in the x2 direction, for example. Hence, it may take long time for detection.

SUMMARY OF THE INVENTION

Accordingly, it is a general object of the present invention to provide a novel and useful semiconductor device, device forming substrate, wiring connection testing method, and manufacturing method of the semiconductor device.

Another and more specific object of the present invention is to provide a semiconductor device, device forming substrate, wiring connection testing method, and manufacturing method of the semiconductor device, whereby a defect of a wiring pattern formed on a substrate can be detected promptly and efficiently.

The above object of the present invention is achieved by a semiconductor device, including:

a substrate;

a semiconductor element formed on the substrate; and a wiring connection testing structure which is formed on the substrate and which includes an electron beam irradiation area where an electron beam is irradiated so that a wiring connection is tested;

wherein the wiring connection testing structure includes
an insulation layer formed on the substrate;
a plurality of first pattern wirings which are formed on the insulation layer in parallel and which include the electron beam irradiation area;
a second pattern wiring formed between the first pattern wirings;
a third pattern wiring which is formed on a lower layer of the second pattern wiring and which is connected to the second pattern wiring; and
a fourth pattern wiring which is formed on an upper layer of the third pattern wiring, is connected to the third pattern wiring, and has the electron beam irradiation area.

The above-mentioned semiconductor device has a structure whereby a defect of a wiring pattern formed on a substrate can be detected promptly and efficiently.

The above object of the present invention is also achieved by a device forming substrate, including:
a substrate;
a semiconductor device formed on the substrate; and
a wiring connection testing structure which is formed on the substrate and which includes an electron beam irradiation area where an electron beam is irradiated so that a wiring connection is tested;
wherein the wiring connection testing structure includes
an insulation layer formed on the substrate;
a plurality of first pattern wirings which are formed on the insulation layer in parallel and which include the electron beam irradiation area;
a second pattern wiring formed between the first pattern wirings;
a third pattern wiring which is formed on a lower layer of the second pattern wiring and which is connected to the second pattern wiring; and
a fourth pattern wiring which is formed on an upper layer of the third pattern wiring, is connected to the third pattern wiring, and has the electron beam irradiation area.

The above-mentioned device forming substrate has a structure whereby a defect of a wiring pattern formed on the substrate can be detected promptly and efficiently.

Other objects, features, and advantages of the present invention will become more apparent from the following detailed description when read in conjunction with the accompanying drawings.

DETAILED DESCRIPTION OF THE PREFERED EMBODIMENTS

A description is given below, with reference to the FIG. 3A through FIG. 17 of embodiments of the present invention.

First Embodiment

Figure 1:
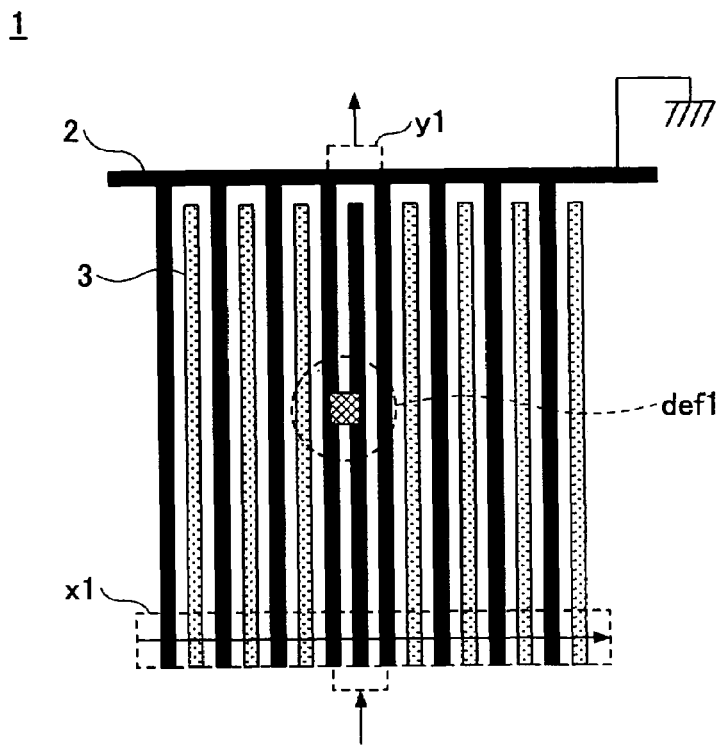
FIG. 1 is a first schematic view showing an example of a related art test pattern for finding a defect part of a wiring.
Figure 2:
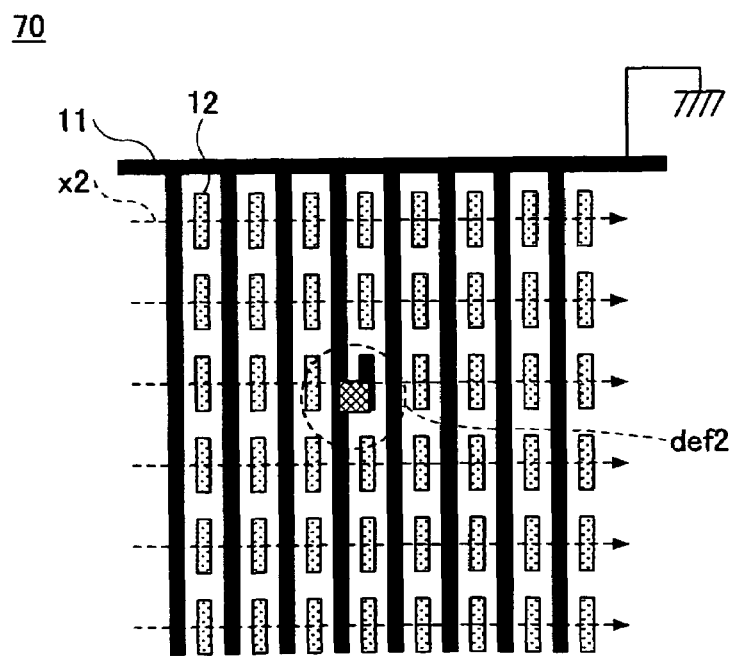
FIG. 2 is a second schematic view showing an example of a related art test pattern for finding a defect part of a wiring.
Figure 3A:
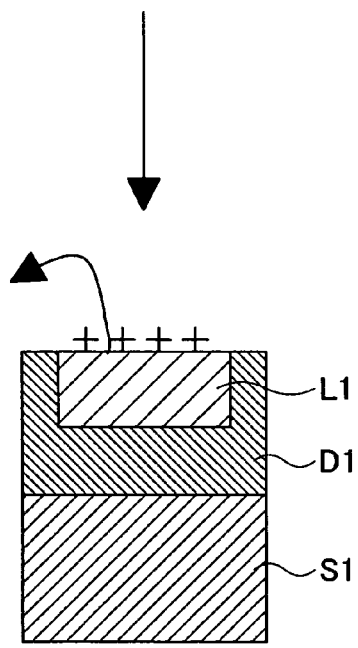
FIG. 3A is a first schematic view for explaining a principle of a testing method of a wiring connection of a first embodiment.
Figure 3B:
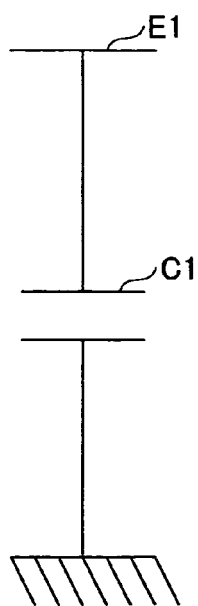
FIG. 3B is a schematic view showing an equivalent circuit of a structure shown in FIG. 3A.

FIG. 3A is a first schematic view of a wiring pattern for explaining a principle of a testing method of a wiring connection of a first embodiment. FIG. 3B is a schematic view showing an equivalent circuit of the structure shown in FIG. 3A.

Referring to FIG. 3A, in this wiring pattern, a wiring pattern L1 is formed on an insulation layer D1 formed on a substrate S1 made of, for example, Si. The surroundings of the wiring pattern L1 are insulated by the insulation layer D1 while one surface of the wiring pattern L1 is exposed. In addition, the wiring pattern L1 is capacitively coupled to the substrate S1 which is grounded.

In a case where the exposed surface of the wiring pattern L1 is observed by, for example, an electron microscope, an electron beam is irradiated on the surface and a secondary electron irradiated from the surface is caught, so that an image of the wiring surface can be formed. In this case, if the wiring pattern L1 is charged up, the amount of the secondary electrons irradiated from the surface is changed and a voltage contrast (VC) is generated, so that the density of the image is extremely changed. In this case, the irradiation amount of the electron beams necessary for the wiring pattern L1 to charge up depends on a capacity C1 of the wiring pattern L1.

In the present invention, the existence of a defect of a short circuit of the wiring pattern L1 is detected by using the change of the state of the generation of such as the VC. For example, in the present invention, plural wiring patterns whose surroundings are insulated and therefore function in electric floating states and which have different capacities are detected, so that it is possible to detect a defect between the plural wiring patterns promptly and efficiently.

Figure 4A:
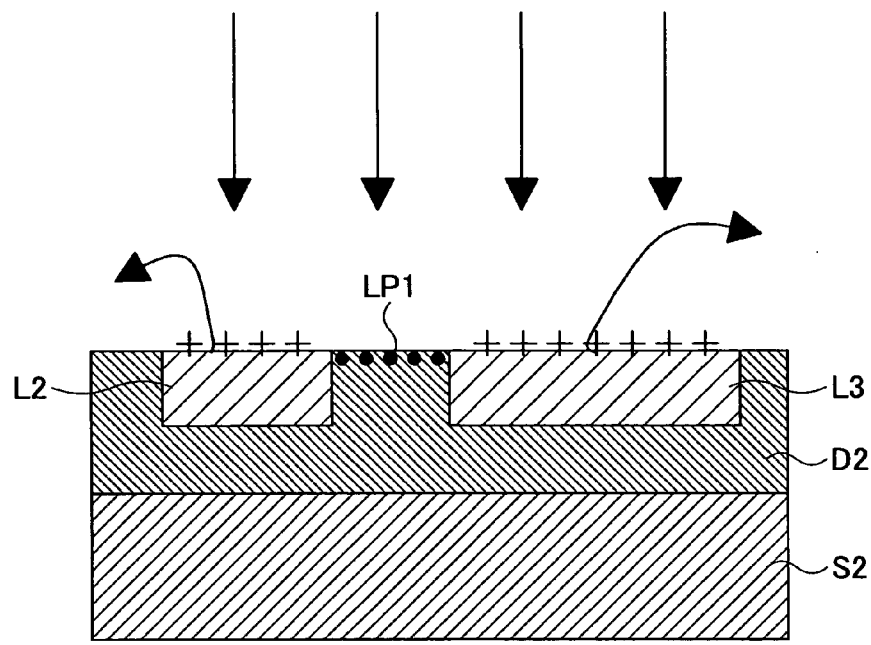
FIG. 4A is a first schematic view for explaining a principle of a testing method of a wiring connection of a second embodiment.
Figure 4B:
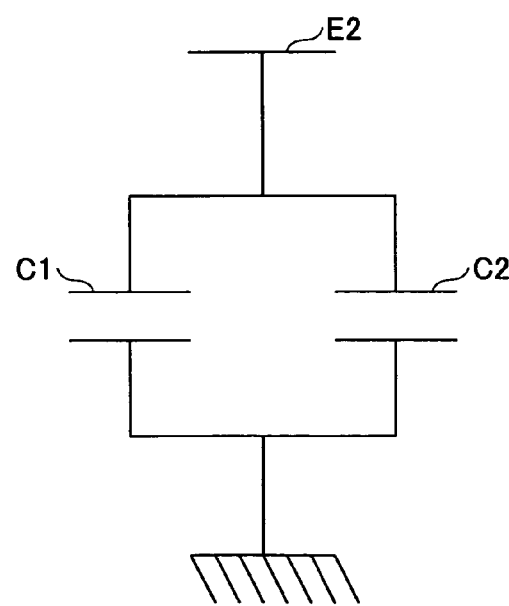
FIG. 4B is a schematic view showing an equivalent circuit of a structure shown in FIG. 4A.

FIG. 4A is a first schematic view of a wiring pattern for explaining a principle of a testing method of a wiring connection of a second embodiment. FIG. 4B is a schematic view showing an equivalent circuit of the structure shown in FIG. 4A.

Referring to FIG. 4A, in this wiring pattern, wiring patterns L2 and L3 are formed on an insulation layer D2 formed on a substrate S2 made of, for example, Si. The wiring patterns L2 and L3 have different capacities. The surroundings of the wiring patterns L2 and L3 are insulated by the insulation layer D2 while one surface of each of the wiring patterns L2 and L3 is exposed. In addition, the wiring patterns L2 and L3 are capacitively coupled to the substrate S2 which is grounded.

In a case where the exposed surface of the wiring pattern L2 is observed by, for example, an electron microscope, it is found that the wiring pattern 2 is charged up at a designated point, so that the VC is generated and the density of the image is extremely changed, by observing the wiring pattern L2 in a longitudinal direction with the electron microscope.

In this case, if, for example, the wiring patterns L2 and L3 are shorted at a short defect LP1, the capacity of the wiring pattern is changed so that a part where the VC is generated is changed. In the present invention, a part where the wiring pattern is shorted is detected by this phenomenon.

FIG. 4B is a schematic view showing an equivalent circuit of a case where the wiring patterns L2 and L3 are shorted. In this case, the surface potential of the wiring pattern depends on the radiation amount of the electron beams, a capacity C2 of the wiring pattern L2, and a capacity C3 of the wiring pattern L3.

That is, states where the VC is generated are different between the short of the wiring patterns L2 and L3 being generated and not being generated, due to the differences of generations of the charging up in a case where the electron beam is irradiated. Hence, it is possible to detect a defect promptly and efficiently by using the difference of the states where the VC is generated.

Thus, in the wiring connection testing method of the present invention, surface observation for details of a micro pattern is not required. Hence, it is possible to easily detect the defect of the wiring of the micro pattern. In addition, it is possible to detect the defect of a short that cannot easily be detected by a normal observation of the wiring surface, such as the defect of a short of the wiring formed inside of the insulation layer in a case where the insulation layer is, for example, porous.

Figure 5:
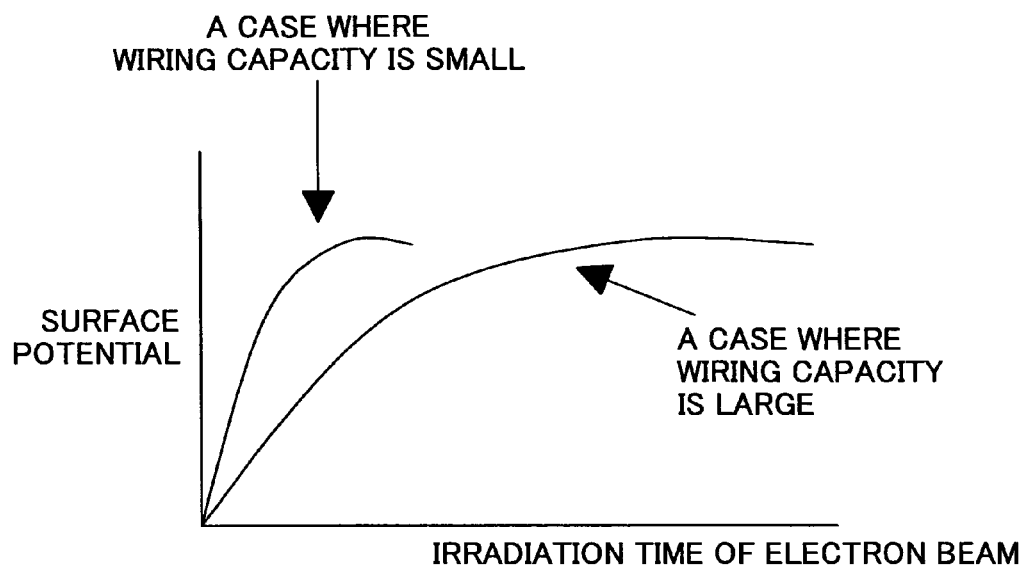
FIG. 5 is a graph showing a tendency of a change of a surface potential of wiring formed on an insulation layer on the substrate in a case where an electron beam is irradiated on the wiring.

FIG. 5 is a graph showing a tendency for change of the surface potential of wiring formed on an insulation layer on a substrate in a case where an electron beam is irradiated on the wiring.

As shown in FIG. 5, in a case where the wiring capacity is large, the change of the surface potential of the wiring against the amount of irradiation (irradiation time) of the electron beam is slow. On the other hand, in a case where the wiring capacity is small, the change of the surface potential of the wiring against the amount of irradiation (irradiation time) of the electron beam is drastic and the charge up state is generated by a small amount of irradiation from the electron beam.

In the present invention, the difference of the change of the surface potential of the wiring due to the difference of the wiring capacity is regarded as the difference of the generation of the VC so that the defect of the short of the wiring is detected.

Figure 6A:
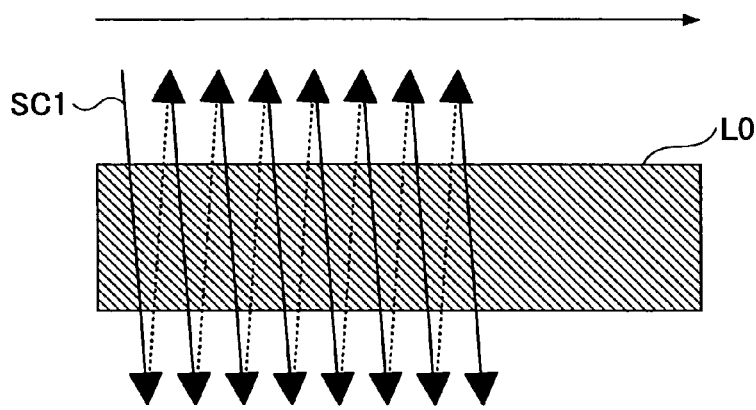
FIG. 6A is a plan view schematically showing a method for irradiating the electron beam on the wiring surface.

FIG. 6A is a plan view schematically showing a method for irradiating the electron beam on the wiring surface in the wiring connection testing method of this embodiment.

Referring to FIG. 6A, in a case where the electron beam is irradiated onto a wiring L0, the electron beam is irradiated in turn by crossing the wiring L0 along directions SC1 shown by arrows so as to move along the longitudinal direction of the wiring L0.

Figure 6B:
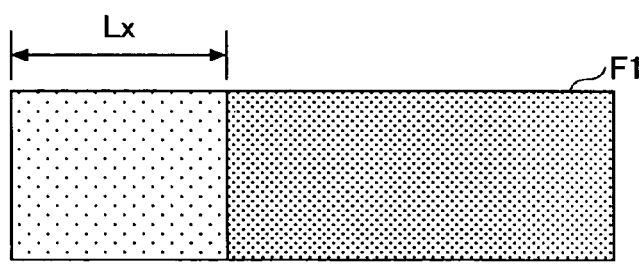
FIG. 6B is a schematic view showing a state of a generation of a VC corresponding to the irradiation of the electron beam shown in FIG. 6A.
Figure 6C:
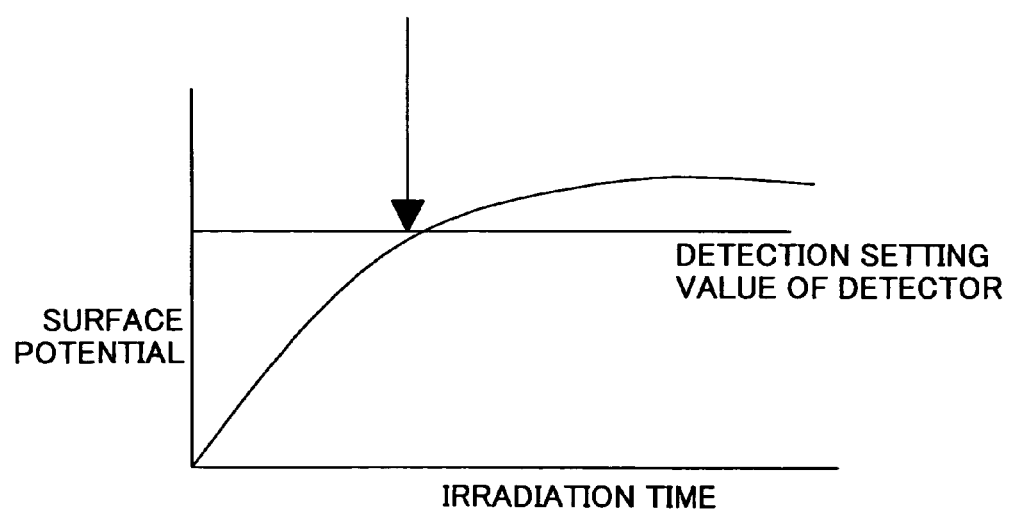
FIG. 6C is a graph showing a change of a surface potential of wiring corresponding to the irradiation of the electron beam shown in FIG. 6A.

FIG. 6B is a schematic view showing a state of the generation of the VC corresponding to the irradiation of the electron beam shown in FIG. 6A. FIG. 6C is a graph showing a change of the surface potential of the wiring corresponding to the irradiation of the electron beam shown in FIG. 6A.

Referring to FIGS. 6B and 6C, as the electron beam is irradiated onto the wiring L0 by observing with the electron microscope, the surface potential of the wiring is changed as shown in FIG. 6C. When the electron beam reaches a part which is a length Lx far from the edge of the wiring L0, the VC is generated, so that the density (brightness) of the image to be observed is drastically changed.

Figure 7:
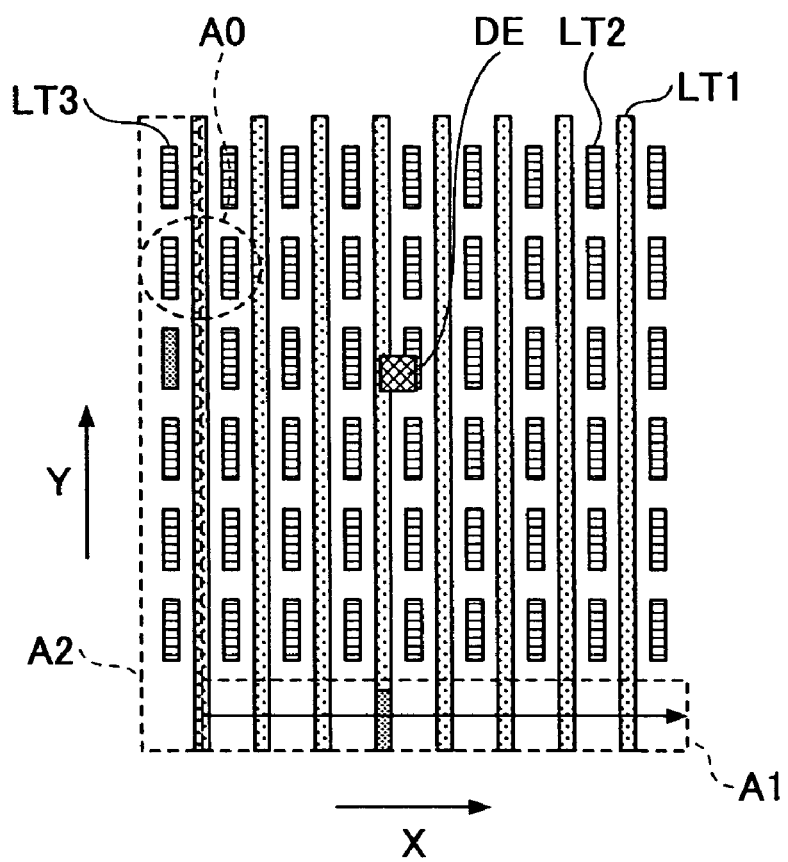
FIG. 7 is a plan view schematically showing a wiring connection testing structure of the first embodiment.

Next, an example of a configuration of a detailed wiring connection testing structure for implementing a test of a wiring connection by the present invention is discussed with reference to FIG. 7. FIG. 7 is a plan view schematically showing a wiring connection testing structure of the first embodiment.

Referring to FIG. 7, plural wiring structures are formed on an insulation layer formed on a substrate. The wiring structures are in an electric floating state and the surroundings of the wiring structures are insulated. For example, a first wiring structure is made of plural wiring patterns LT1 formed on the insulation layer parallel to each other. A second wiring structure corresponding to the first wiring structure has a multi-layer wiring structure including plural wiring patterns LT2 formed between neighboring wiring patterns LT1 and having lengths shorter than lengths of the wiring patterns LT1.

The wiring patterns LT2 are formed between the neighboring plural wiring patterns LT1. The wiring patterns LT2 and the wiring patterns LT1 are arranged on the insulation layer reciprocally. The neighboring wiring patterns LT1 and LT2 are arranged in parallel and the wiring patters LT2 situated at both sides of the wiring pattern 1 are arranged in parallel and have, for example, same lengths.

For the convenience of explanation, a direction in which the wiring pattern LT1 or LT2 extends, namely a longitudinal direction, is set as the Y direction. A direction perpendicular to the Y direction is set as the X direction.

The second wiring structure includes a wiring pattern of a lower layer (not shown in FIG. 7) that connects to the wiring pattern LT2. Plural wiring patterns among the wiring patterns LT2, which are formed on a substantially same line along the x direction, are electrically connected to each other via the wiring pattern of the lower layer. That is, the wiring pattern of the lower layer which extends in the X direction is formed on the lower layer of the wiring pattern LT2. The wiring pattern of the lower layer is electrically connected to plural wiring patterns LT2 arranged in the X direction. Furthermore, the wiring pattern LT3 connected to the wiring pattern LT2 by the wiring pattern of the lower layer is formed on an end part in the X direction along the Y direction so as to form a line.

An example of the method for implementing the test of the wiring connection by using the wiring connection test structure is as follows.

End parts of the wiring patterns LT1 in an area A1 are observed in the X direction in turn by using, for example, a scanning electron microscope (SEM), so that a wiring pattern having generation of the VC or a wiring pattern wherein a state where the VC is generate is different from other wiring patterns is detected.

Next, end parts of the wiring patterns LT3 in an area A2 are observed in the Y direction in turn by using, for example, the scanning electron microscope (SEM), so that a wiring pattern having generation of the VC or a wiring pattern wherein a state where the VC is generated is different from other wiring patterns is detected.

It is possible to detect a short circuit part DE where the wiring is shorted by the above-mentioned two types of the observations. In this case, even if the short is micro or is not disposed on a surface, it is possible to detect the short circuit part promptly and efficiently.

Figure 8A:
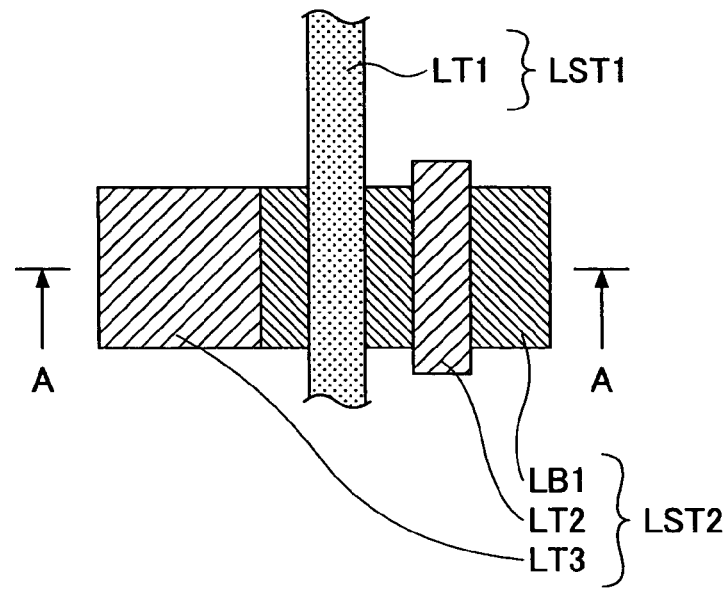
FIG. 8A is an enlarged plan view showing a part of the wiring connection testing structure shown in FIG. 7.

FIG. 8A is an enlarged plan view showing an A0 part of the wiring connection testing structure shown in FIG. 7.

The wiring patterns LT2 and LT3 face each other via the wiring pattern LT1. The wiring patterns LT2 and LT3 are connected by the wiring pattern LB1 which is a wiring pattern of a lower layer of the wiring patterns LT2 and LT3. An illustration of the wiring pattern LB1 is omitted in FIG. 7.

Figure 8B:
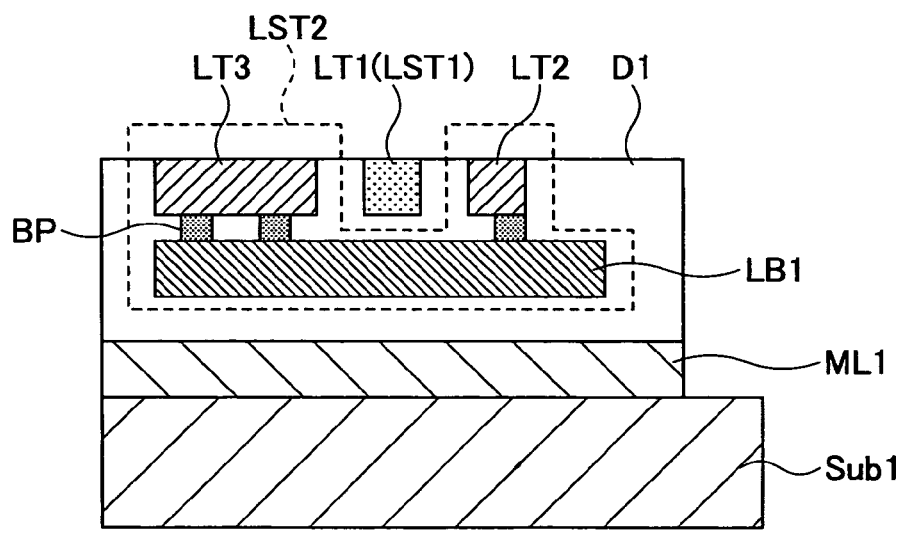
FIG. 8B is a cross-sectional view of a structure shown in FIG. 8A.

In this case, the wiring patterns LB1 and LT2 or the wiring patterns LB1 and LB3 are electrically connected by via plug (not shown in FIG. 8A). That is, the wiring patterns LB1, LT2 and LT3 form a second wiring structure LST2. The wiring pattern LT1 forms a first wiring structure LST1. The first wiring structure LST1 and second wiring structure LST2 stand face to face with the insulation layer formed on the substrate in an electrically insulated floating state. FIG. 8B is a cross-sectional view taken along the line A-A of the structure shown in FIG. 8A.

Referring to FIG. 8B, the first wiring structure LST1 and the second wiring structure LST2 are formed in the insulation layer D1 formed on a substrate Sub1 made of, for example, Si, in a state where the surroundings of the first wiring structure LST1 and the second wiring structure LST2 are insulated by the insulation layer D1. That is, the first wiring structure LST1 and the second wiring structure LST2 are substantially formed in an electrically floating state.

The wiring patterns LB1 and LT2 or the wiring patterns LB1 and LB3 are electrically connected by a via plug BP.

A conductive layer ML1, for example, may be formed between the substrate Sub1 and the insulation layer D1. In this case, the wiring pattern LB1 is capacitively coupled to the conductive layer ML1.

In a case where the conductive layer ML1 is a silicide film, it is possible to easily form the conductive layer ML1. The conductive layer ML1 may be a metallic silicide film such as a Co silicide film. The metallic silicide film such as the Co silicide film may be formed at the same time when a silicide film is formed on a source area or a drain area is formed in a case where a MOS transistor is formed on the substrate.

Second Embodiment

Next, a structure, where the wiring connection testing structure discussed in the first embodiment is formed on the semiconductor substrate where a semiconductor device is formed, is discussed with reference to FIG. 9.

Figure 9:
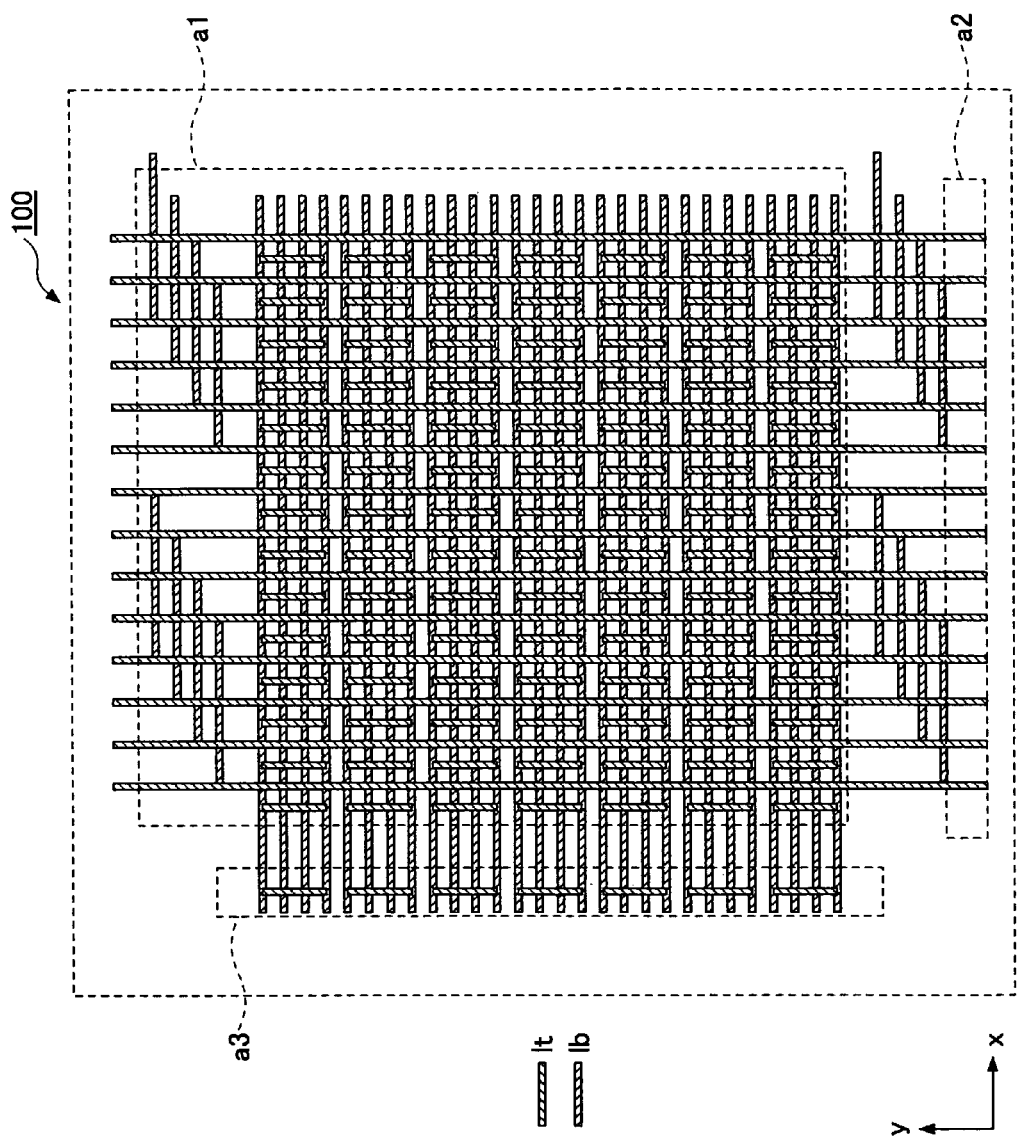
FIG. 9 is a plan view schematically showing a wiring connection testing structure of the second embodiment.

FIG. 9 is a plan view schematically showing a wiring connection testing structure 100 of a second embodiment;

Referring to FIG. 9, the wiring connection testing structure of this embodiment includes a structure similar to the wiring connection testing structure shown in FIG. 7. In this embodiment, a wiring pattern is formed on the insulation layer (not shown in FIG. 9). The wiring pattern includes plural top layer wiring patterns lt and a bottom layer wiring pattern lb. The top layer wiring pattern lt is a wiring pattern whose one surface is exposed. The bottom wiring pattern lb is formed at a lower layer of the top layer wiring pattern lt.

A wiring connection structure corresponding to the wiring connection structure LST1 shown in FIG. 8A through FIG. 8B is formed by a part of the plural top wiring patterns lt and the bottom wiring pattern lb. A wiring connection structure corresponding to the wiring connection structure LST2 shown in FIG. 8A through FIG. 8B is formed by other top wiring patterns lt and the bottom wiring pattern lb.

An area a2 corresponds to the area A1 shown in FIG. 7 and is an area where the electron beam is irradiated so that the VC is detected. An area a3 corresponds to the area A2 shown in FIG. 7 and is an area where the electron beam is irradiated so that the VC is detected. Wiring patterns corresponding to the wiring patterns LT1 and LT2 shown in FIG. 7 are formed in the area a1 by the top layer wiring pattern lt. In the wiring connection testing structure shown in FIG. 9, it is possible to detect a defect part of the wiring pattern by implementing the test of the wiring connection in a way similar to the way shown in FIG. 7. For the convenience of the explanation, a direction in which the top layer wiring lt extends is set as the y direction. A direction which is perpendicular to the y direction and in which the bottom layer wiring lb extends is set as the x direction.

Figure 10:
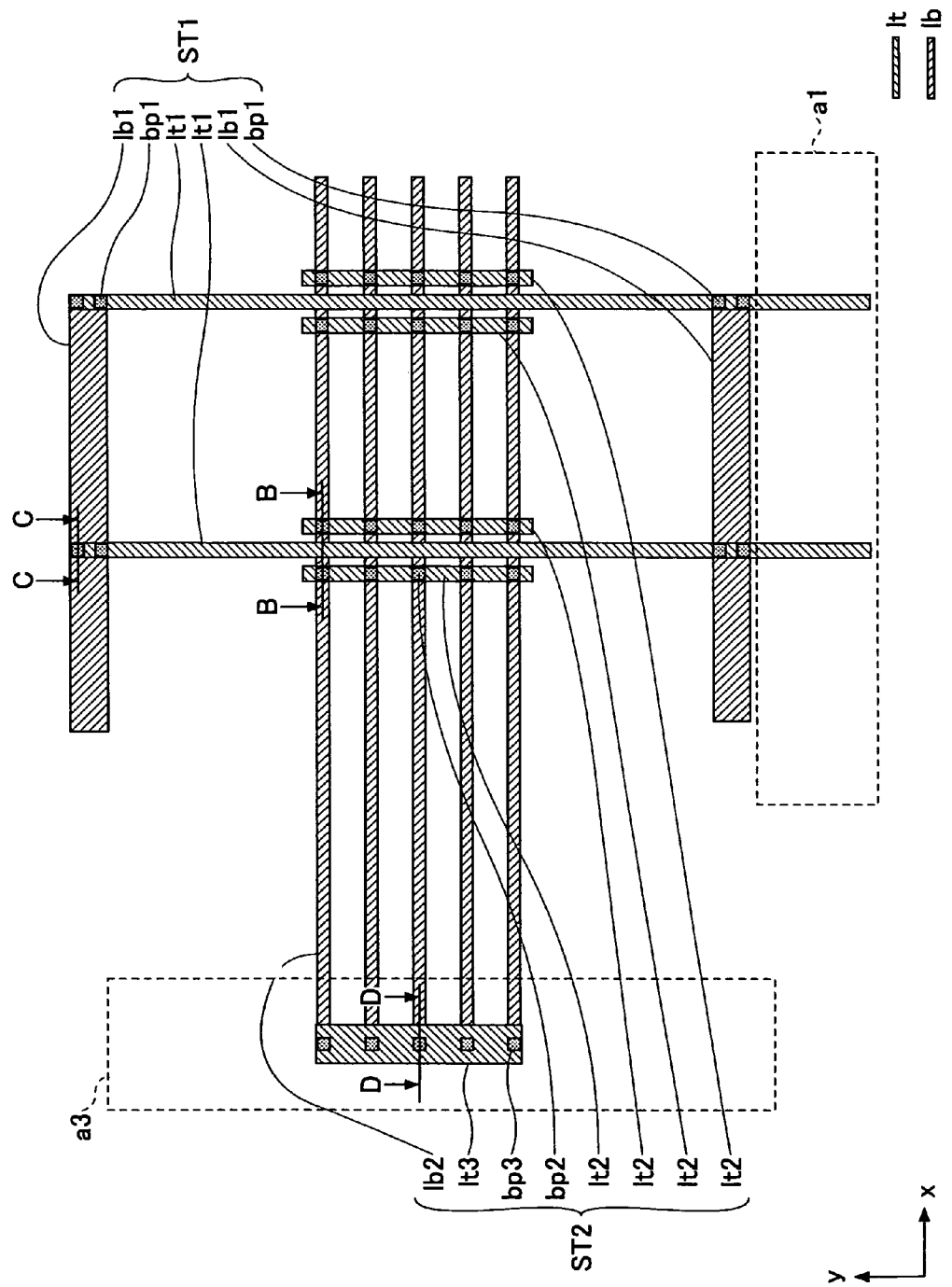
FIG. 10 is an enlarged view showing a part of the wiring connection testing structure shown in FIG. 9.

FIG. 10 is an enlarged view showing a part of the wiring connection testing structure shown in FIG. 9. In FIG. 10, parts that are the same as the parts already discussed above are given the same reference numerals, and explanation thereof will be omitted.

Referring to FIG. 10, one end part of two wiring patterns lt1 arranged in parallel and having longest lengths in y direction among the plural top layer wiring patterns ltl, is connected to the wiring pattern lb1 of the bottom layer wiring pattern lb by the via plug bp1. Furthermore, the area a1 where the change of the VC is detected by the electron microscope is formed at the other end part of the wiring pattern lt1. In the vicinity of the area a1, the wiring pattern lt1 is connected to the other wiring pattern lb1 via the via plug bp1. That is, two wiring patterns lt1 are connected to two wiring patterns lb1 by the via plugs bp1. These wiring patterns and these via plugs form the wiring structure ST1. In this case, for example, the wiring pattern lt1 has a width (length in the x direction) of 100 nm and a length (length in the y direction) of 1300 μm. The wiring pattern lb1 has a width (length in the y direction) of 2.5 μm and a length (length in the x direction) of 20 μm. The wiring pattern lb1 is capacitively coupled to the substrate situated at the lower payer of the insulation layer or a conductive film formed on the substrate.

Furthermore, as the top layer wiring pattern lt, a wiring pattern having a length shorter than the wiring pattern lt1 is formed in a short strip state. For example, two wiring patterns lt2 are formed in the vicinity of each of the wiring patterns lt1 and provided at both sides of the wiring patterns lt1 so as to face each other.

The wiring pattern lb2 within the bottom layer wiring pattern lb is connected to the wiring pattern lt2 by the via plug bp2. The wiring pattern lb2 is perpendicular to the wiring pattern lt2 and extends in the x direction. One end part in the x direction of the wiring pattern lb2 is connected to the wiring pattern lt3 that is the top layer wiring pattern by the via plug bp3. The wiring pattern lt3 is arranged in the y direction in the area a3 where the VC is detected so that the change of the state of the VC is detected by the electron microscope observation. Thus, the wiring structure ST2 is formed by the wiring patterns lt2 and lb2 and the via plugs bp2 and bp3.

In this case, for example, the wiring pattern lt2 has a width (length in the x direction) of 100 nm and a length (length in the y direction) of 10 μm. The wiring pattern lt3 has a width (length in the x direction) of 1.88 μm and a length (length in the y direction) of 10 μm. The wiring pattern lb2 has a width (length in the y direction) of 200 nm and a length (length in the x direction) of 1000 μm. The via plugs bp1, bp2 and bp3 have diameters of 100 nm. The wiring pattern lb2 is capacitively coupled to the substrate situated at the lower layer of the insulation layer or a conductive film formed on the substrate.

In the above-discussed wiring connection testing structure of this embodiment, the capacitance of the wiring structure ST2 is substantially 10 times the capacitance of the wiring connection testing structure ST1.

Figure 11A:
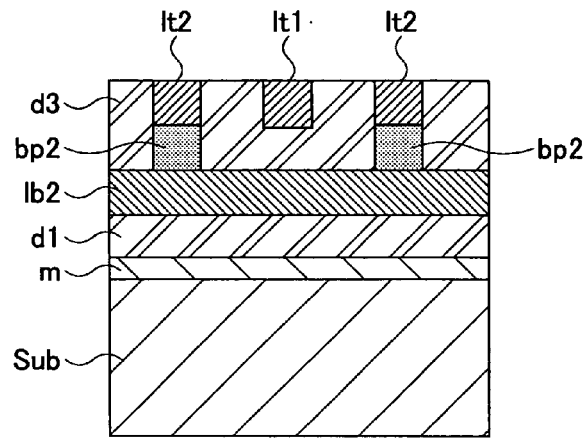
FIG. 11A is a first cross-sectional view of a structure shown in FIG. 10.
Figure 11B:
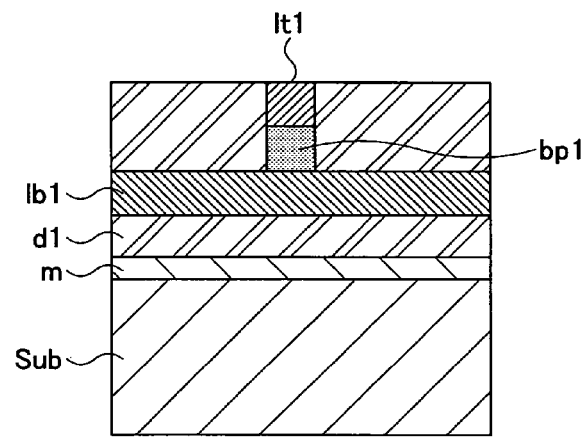
FIG. 11B is a second cross-sectional view of the structure shown in FIG. 10.
Figure 11C:
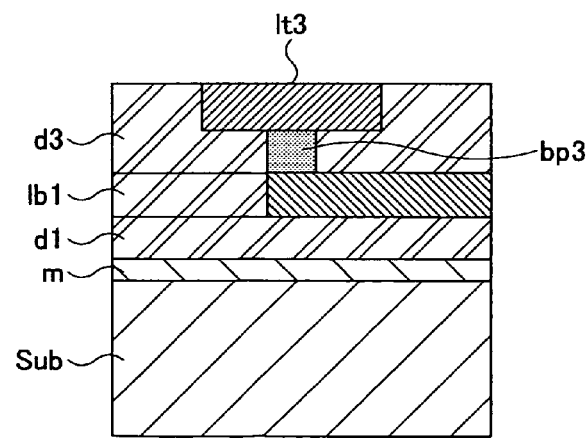
FIG. 11C is a third cross-sectional view of the structure shown in FIG. 10.

FIG. 11A is a cross-sectional view taken along the line B-B of a structure shown in FIG. 10. FIG. 11B is a cross-sectional view taken along the line C-C of a structure shown in FIG. 10. FIG. 11C is a cross-sectional view taken along the line D-D of a structure shown in FIG. 10. In FIG. 11A through FIG. 11C, parts that are the same as the parts discussed above are given the same reference numerals, and explanation thereof will be omitted.

Referring to FIG. 11A through FIG. 11C, the wiring patterns and via plugs forming the wiring structure ST1 and the wiring patterns and via plugs forming the wiring structure ST2 are formed on the insulation layers d1 through d3 on the substrate Sub made of semiconductor material such as Si. That is, the insulation layer d1 is formed on the substrate Sub. The wiring patterns lb1 and lb2 are patterned and formed on the insulation layer d2 stacked on the insulation layer d1. The wiring patterns lb1 and lb2 and the via plugs bp1, bp2 and bp3 are formed on the insulation layer d3 stacked on the insulation layer d2.

A conductive film m made of, for example, Co silicide, may be formed on the substrate. In this case, the pattern wirings lb1 and lb2 are capacitively coupled to the substrate Sub via the conductive film m.

Here, an example of the method for implementing the wiring connection test by using the wiring connection testing structure 100 of this embodiment is discussed.

In this example, a wiring defect (short of the wiring) between the wiring patterns lt1 and lt2 is detected.

For example, the VC detection is implemented in turn to 75 nm in the y direction of plural wiring patterns by using the scanning type electron microscope set for observation conditions of an extracting field. More specifically, the VC detection is implemented at an end part of the wiring pattern lt1 in the area a1 shown in FIG. 9 and FIG. 10 under a condition of 100 nm (pixel) as a minimum resolution and 100 nA of an electron beam electric current. In this case, it is preferable that a contrast of an image of the electron microscope be turned over when an electron beam of 75 pixels (100 nm in the x direction and 7.5 μm in the y direction) is irradiated on the wiring pattern lt1 in a case where the wiring structure ST1 does not have a short part.

Figure 12A:
FIG. 12A is a first schematic view showing a state of a VC of a wiring pattern.
Figure 12B:
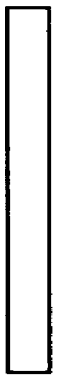
FIG. 12B is a second schematic view showing the state of the VC of the wiring pattern.

In the above-mentioned case, if the wiring structure ST1 does not have a short part, more specifically, if the wiring patterns lt1 and lt2 are not shorted, as shown in FIG. 12A, there are a lot of dark areas in the area a2 as the VC state. If the wiring structure ST1 has a short part, as shown in FIG. 12B, there are a lot of bright areas in the area a2 as the VC state. Hence, it is possible to specify the wiring pattern having a short defect among plural wiring patterns lt1, that is coordinates in the x direction of the short defect.

Figure 13A:
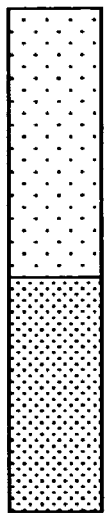
FIG. 13A is a third schematic view showing a state of the VC of the wiring pattern.
Figure 13B:
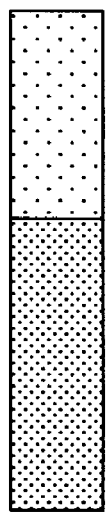
FIG. 13B is a fourth schematic view showing the state of a VC of the wiring pattern.

Similarly, in the area a3, a similar VC detection is implemented to the plural wiring patterns lt3. In this case, in a case where there is no short defect of the wiring pattern due to the difference of the capacitance between the wiring structures ST1 and ST2, as shown in FIG. 13-A, if an electron beam of 750 pixels (1.88 μm in the x direction, 4 μm in the y direction) is scanned against the wiring pattern lt3, the contrast of the image of the electron microscope is turned over. Furthermore, since plural wiring patterns lt2 connecting the wiring pattern lb2 extending in the x direction exist, a position where the contrast is turned over is changed corresponding to the number of the short parts of the wiring. For example, if there is a single short defect, as shown in FIG. 13B, the position where the contrast is turned over is moved 75 pixels (1.88 μm in the x direction, 0.4 μm in the y direction). If there are further short defects, the position where the contrast is turned over is moved corresponding to the number of the short parts so that the y coordinate of the defect position is specified. It is possible to detect a part where the defect of the short of the wiring is based on the result of the VC detection.

According to this embodiment, it is possible to promptly and efficiently detect the defect of the wiring pattern formed on the substrate. More specifically, it is possible to promptly and efficiently detect the defect whose configuration observed on the surface of the insulation layer or the wiring pattern is a micro or a short defect not appearing on the surface of the insulation layer or the wiring pattern.

The insulation layer which is made of low dielectric constant material and which is frequently used as an interlayer dielectric has low mechanical strength. Hence, a micro hole or crack may be generated inside of the insulation layer so that a short defect may be generated in a case where the wiring pattern may be formed. In this embodiment, it is possible to easily and promptly detect a short defect which does not appear on the surface but is formed inside of the insulation layer. As a low dielectric constant material, for example, a material including silicon and carbon, such as SiC, SiCo, or SiCO(H) is used. Such a low dielectric constant material is formed by a coating method, CVD method, or the like.

As the low dielectric constant material, for example, a porous material whose inside is porous may be used so that the inside of the insulation layer has a porous structure and the dielectric constant can be reduced. In this case, the short defect of the wiring pattern may be in the porous material. Since such a short defect cannot appear in the insulation layer or the surface of the wiring pattern, it is difficult to find the short defect by the conventional art. In this embodiment, it is possible to easily and promptly detect the short defect of the wiring pattern formed in the insulation layer made of the porous material.

Third Embodiment

The wiring connection testing structure of the first or second embodiment may be formed on the semiconductor substrate so that a semiconductor device is formed. In this case, the present invention can be used for finding a connection state of wiring of the semiconductor device. For example, the wiring connection testing structure can be formed at the same time when a multilayer wiring structure connected to the semiconductor device is formed.

Figure 14:
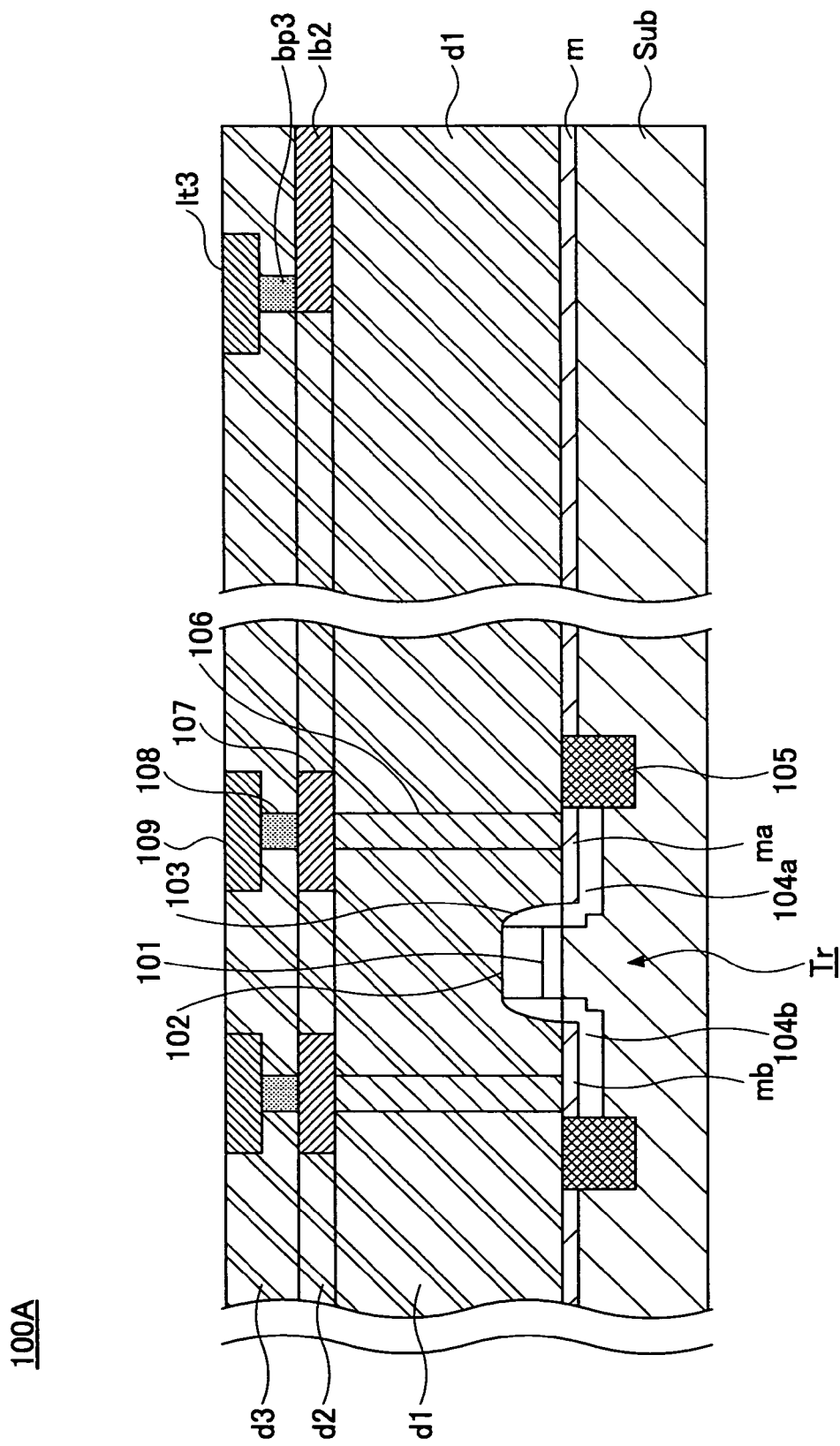
FIG. 14 is a cross-sectional view schematically showing a semiconductor device having a wiring connection testing structure of a third embodiment.

FIG. 14 is a cross-sectional view schematically showing a semiconductor device having a wiring connection testing structure of a third embodiment. In FIG. 14, parts that are the same as the parts already discussed above are given the same reference numerals, and explanation thereof will be omitted.

Referring to FIG. 14, in a semiconductor device 100A of the embodiment, a MOS transistor Tr is formed on the substrate SUB where the wiring connection testing structure 100 shown in FIG. 9 or FIG. 10 is formed. In FIG. 14, only a part of the semiconductor device 100 is illustrated and an illustration of other parts is omitted.

In an element forming area on the substrate Sub which is separated by an element separating insulation part 105 formed by the STI, a source area 104a made of an impurity diffusion layer and a drain area 104b face each other via a channel area. A gate electrode 102 formed on a gate insulation film 101 is provided on the channel area. A CO silicide layer ma is formed on the source area 104a and a CO silicide layer mb is formed on the drain area 104b. The contact plug 106 made of, for example, tungsten, is formed in the insulation layer d1.

The contact plug 106 is connected to the pattern wiring 107 made of, for example, Cu or Al and formed in the insulation layer d2. In addition, the wiring pattern 107 is connected to the pattern wiring 109 and the via plug 108 made of, for example, Cu and formed in the insulation layer d3.

In this case, the Co silicide layers ma and mb can be formed at the same when the conductive layer m is formed. The pattern wiring 107 can be formed at the same when the pattern wirings lb1 and lb2 are formed. The via plug 108 can be formed at the same when the pattern wirings bp1, bp2, and bp3 are formed. The pattern wiring 109 can be formed at the same when the pattern wirings lt1, lt2, and lt3 are formed. These can be formed in separate steps.

Furthermore, for example, the semiconductor device such as the MOS transistor Tr discussed above or the wiring connection testing structure 100 may be arranged in various positions on the substrate Sub if necessary.

Figure 15A:
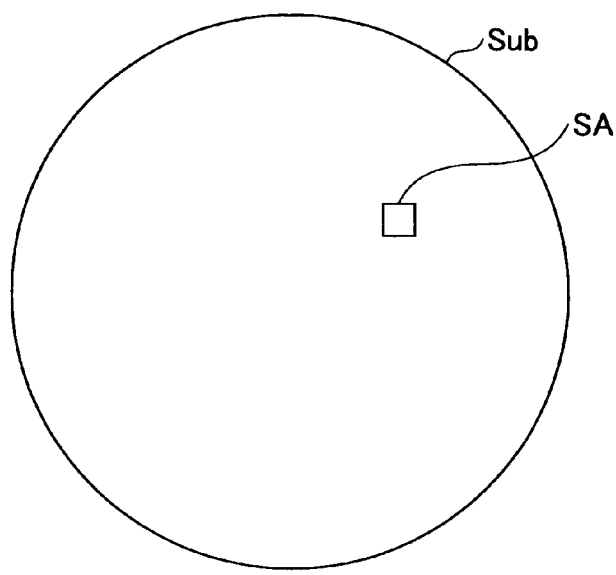
FIG. 15A is a plan view of an entire of a silicon substrate.
Figure 15B:
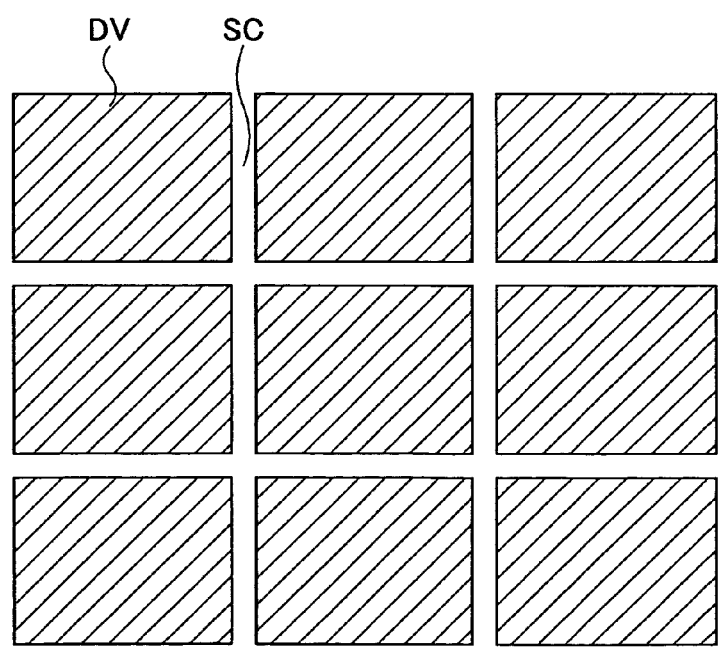
FIG. 15B is an partially enlarged view of the silicon substrate shown in FIG. 15A.

FIG. 15A is a plan view of the entirety of the silicon substrate Sub. The wiring connection testing structure 100 may be arranged in various positions on the substrate Sub. For example, it is preferable that the wiring connection testing structure 100 be formed at a circumferential edge part where the semiconductor device is not formed. FIG. 15B is a partially enlarged view of the area SA on the silicon substrate Sub shown in FIG. 15A. For example, there is a device forming area DV and a scribe line SC on the substrate Sub. For example, the semiconductor device is formed in the device forming area DV. The line SC separates the device area DV and the line SC functions as a scribe line in a case where the device area DV is cut. For example, the wiring connection testing structure 100 may be formed in the device area DV or the scribe line SC.

In a case where the wiring connection testing structure 100 is formed in the scribe line SC, the wiring connection testing structure 100 is cut off when the device area DV is cut off and packaged in the semiconductor device.

Fourth Embodiment

Figure 16:
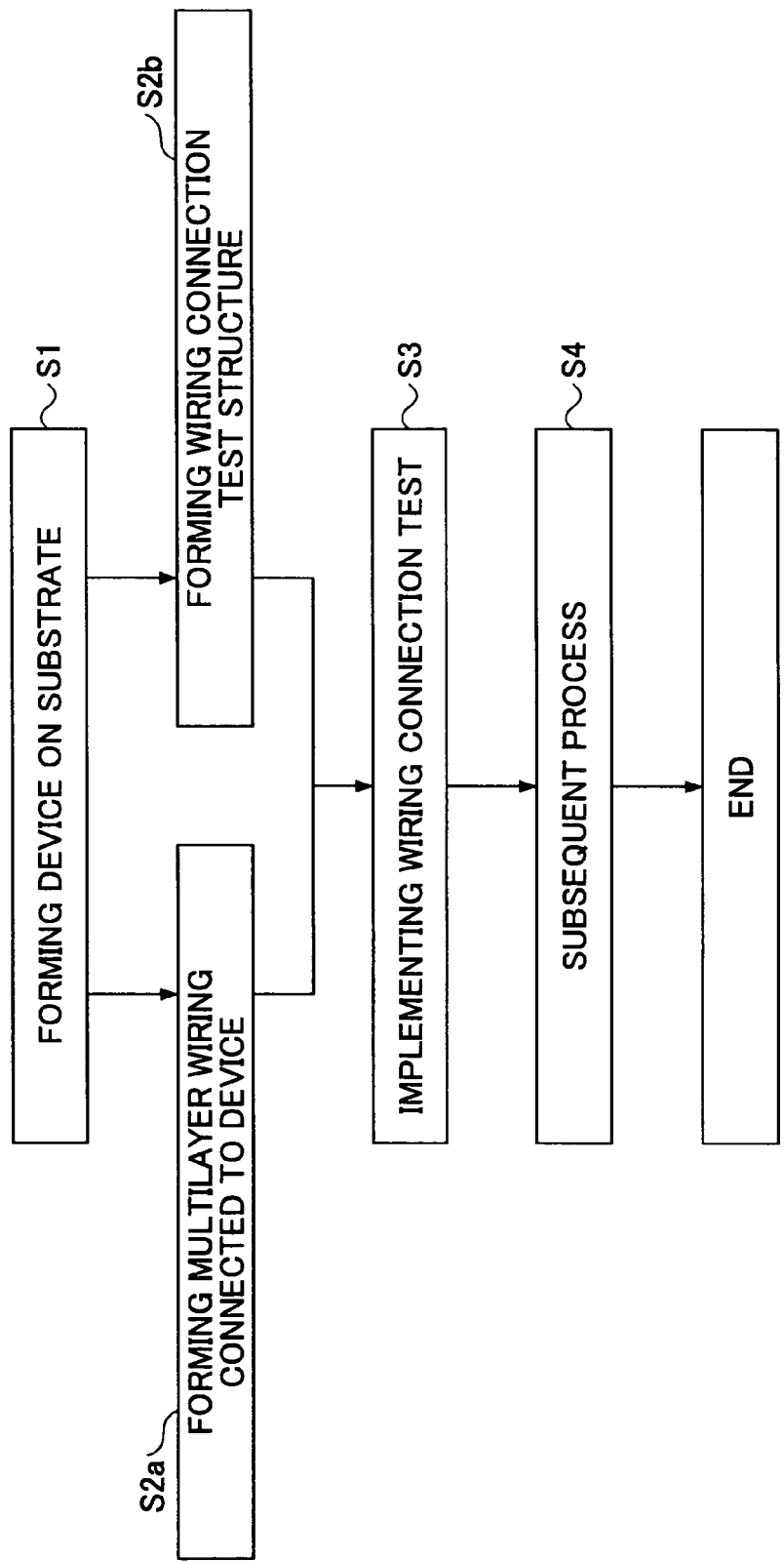
FIG. 16 a flowchart showing an example of a manufacturing method of a semiconductor device shown in FIG. 14.

FIG. 16 is a flowchart showing an example of a manufacturing method of a semiconductor device shown in FIG. 14.

Referring FIG. 16, in step 1, the MOS transistor Tr is formed on the substrate Sub shown in FIG. 14 by a designated method.

Next, in step 2a, the multilayer wiring structure connected to the MOS transistor Tr formed by the wiring patterns 107 and 109 and the via plug 108 is formed. In step 2b, the wiring patterns lb1, lb2, lt1, lt2 and lt3 and the via plugs bp1, bp2 and bp3 of the wiring connection testing structure are formed. The multilayer wiring structure may be formed at the same time that the wiring connection testing structure is formed.

Next, in step 3, a test for wiring connection is implemented and a short defect of the wiring is confirmed as discussed in the second embodiment. And then, in step 4, if necessary, a process for packaging is implemented so that manufacturing of the semiconductor device is completed.

Figure 17:
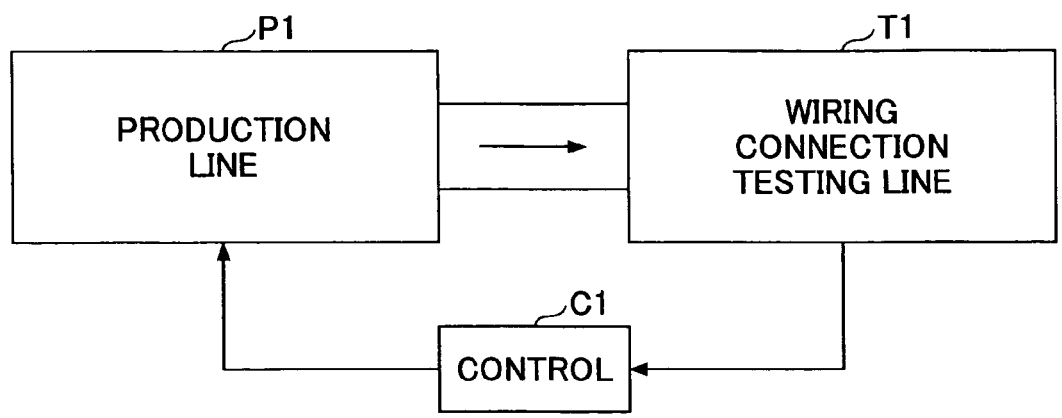
FIG. 17 is a block diagram in a case where the semiconductor device is formed by using a large number of the semiconductor substrates.

FIG. 17 is a block diagram in a case where the semiconductor device is formed by using a large number of the semiconductor substrates.

Referring to FIG. 17, first, in a production line P1 of the semiconductor device and the multilayer wiring structure, a semiconductor device such as the MOS transistor Tr shown in FIG. 14, the multilayer structure, and the wiring connection testing structure are formed on the substrate.

Next, the substrate where the semiconductor device and the wiring connection testing structure are formed is conveyed to a wiring connection testing line T1, so that the short defect of the wiring pattern formed on the substrate is detected, as discussed in the second embodiment, by using the scanning type electron microscope. A result of the detection is sent to a control device C1. By the control device C1, the control of the production line P1, corresponding to the result of the detection, is performed. In this case, a feedback control whereby conditions of the manufacturing process for forming the wiring pattern are changed and the short defect of the wiring pattern is prevented is used as an example of the control.

Furthermore, it is not always necessary to implement the testing method of the wiring connection on all of the substrates where the semiconductor devices are formed. The testing method may be implemented for selected substrates. In addition, the wiring connection test may be implemented for only a substrate where the wiring connection testing structure is formed in a state where the designated numbers of the substrates are included. In this case, the substrate where the wiring connection testing structure is formed may be used as a substrate exclusively for the wiring connection testing. It is not necessary to form a semiconductor device on the substrate where the wiring connection testing structure is formed.

The present invention is not limited to these embodiments, but variations and modifications may be made without departing from the scope of the present invention.

This patent application is based on Japanese Priority Patent Application No. 2005-033549 filed on Feb. 9, 2005, and the entire contents of which are hereby incorporated by reference.

What is claimed is:

1. A semiconductor device, comprising:
   a substrate;
   a semiconductor element formed on the substrate; and
   a wiring connection testing structure which is formed on the substrate and which includes an electron beam irradiation area where an electron beam is irradiated so that a wiring connection is tested;
   wherein the wiring connection testing structure includes
   an insulation layer formed on the substrate;
   a plurality of first pattern wirings which are formed on the insulation layer in parallel and which include the electron beam irradiation area;
   a second pattern wiring formed between the first pattern wirings;
   a third pattern wiring which is formed on a lower layer of the second pattern wiring and which is connected to the second pattern wiring, the third pattern wiring formed in a direction perpendicular to the first pattern wiring; and a fourth pattern wiring which is formed on an upper layer of the third pattern wiring, is connected to the third pattern wiring, and has the electron beam irradiation area;

wherein a plurality of the second pattern wirings is formed between each two immediately adjoined first pattern wirings.

2. The semiconductor device as claimed in claim 1, wherein a plurality of the third pattern wirings and a plurality of the fourth pattern wirings are formed corresponding to the plural second pattern wirings.

3. The semiconductor device as claimed in claim 1, wherein a plurality of the second pattern wirings is connected to the third pattern wiring.

4. The semiconductor device as claimed in claim 1, wherein the first pattern wiring, and the second and third pattern wirings connected to each other, are capacitively coupled to the substrate.

5. The semiconductor device as claimed in claim 4, wherein a capacitance of the first pattern wiring is smaller than capacitances of the second and third pattern wirings connected to each other.

6. The semiconductor device as claimed in claim 4, wherein a conductive film is formed on the substrate; and the first pattern wiring, and the second and third pattern wirings connected to each other, are capacitively coupled to the substrate via the conductive film.

7. The semiconductor device as claimed in claim 6, wherein the conductive film is a metal silicide film.

8. The semiconductor device as claimed in claim 1, wherein another fourth pattern wiring by which the plural first wiring patterns are connected to each other is formed at the lower layer of the first pattern wiring.

9. The semiconductor device as claimed in claim 1, wherein the insulation film is made of a porous material.

10. A semiconductor device, comprising:

a substrate;

a semiconductor element formed on the substrate; and a wiring connection testing structure which is formed on the substrate and which includes an electron beam irradiation area where an electron beam is irradiated so that a wiring connection is tested;

wherein the wiring connection testing structure includes an insulation layer formed on the substrate;

a plurality of first pattern wirings which are formed on the insulation layer in parallel and which include the electron beam irradiation area;

a second pattern wiring formed between the first pattern wirings;

a third pattern wiring which is formed on a lower layer of the second pattern wiring and which is connected to the second pattern wiring; and a fourth pattern wiring which is formed on an upper layer of the third pattern wiring, is connected to the third pattern wiring, and has the electron beam irradiation area;

wherein a plurality of the second pattern wirings is formed between each two immediately adjoined first pattern wirings, wherein the first pattern wiring, and the second and third pattern wirings connected to each other, are capacitively coupled to the substrate.

11. The semiconductor device as claimed in claim 10, wherein a plurality of the third pattern wirings and a plurality of the fourth pattern wirings are formed corresponding to the plural second pattern wirings.

12. The semiconductor device as claimed in claim 10, wherein a plurality of the second pattern wirings is connected to the third pattern wiring.

13. The semiconductor device as claimed in claim 10, wherein a capacitance of the first pattern wiring is smaller than capacitances of the second and third pattern wirings connected to each other.

14. The semiconductor device as claimed in claim 10, wherein a conductive film is formed on the substrate; and the first pattern wiring, and the second and third pattern wirings connected to each other, are capacitively coupled to the substrate via the conductive film.

15. The semiconductor device as claimed in claim 14, wherein the conductive film is a metal silicide film.

16. The semiconductor device as claimed in claim 10, wherein another fourth pattern wiring by which the plural first wiring patterns are connected to each other is formed at the lower layer of the first pattern wiring.

17. The semiconductor device as claimed in claim 10, wherein the insulation film is made of a porous material.

* * * * *

UNITED STATES PATENT AND TRADEMARK OFFICE
CERTIFICATE OF CORRECTION

PATENT NO. : 7,592,623 B2
APPLICATION NO. : 11/115411
DATED : September 22, 2009
INVENTOR(S) : Yasuo Matsumiya Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 196 days.

Signed and Sealed this

Twenty-first Day of September, 2010

David J. Kappos
*Director of the United States Patent and Trademark Office*